United States Patent
Kao et al.

(10) Patent No.: US 7,700,475 B1
(45) Date of Patent: Apr. 20, 2010

(54) PILLAR STRUCTURE ON BUMP PAD

(75) Inventors: Huanhung Kao, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 147 days.

(21) Appl. No.: 11/866,673

(22) Filed: Oct. 3, 2007

Related U.S. Application Data

(60) Provisional application No. 60/828,331, filed on Oct. 5, 2006.

(51) Int. Cl.
- H01L 21/44 (2006.01)
- H01L 23/52 (2006.01)
- H01L 23/48 (2006.01)
- H01L 23/40 (2006.01)
- H01L 23/485 (2006.01)
- H01L 23/498 (2006.01)

(52) U.S. Cl. ............ 438/612; 438/613; 257/737; 257/738; 257/779; 257/780; 257/E23.021; 257/E23.069

(58) Field of Classification Search ............ 438/612, 438/613; 257/737, 738, 789, 780, E23.021, 257/E23.069
See application file for complete search history.

(56) References Cited

U.S. PATENT DOCUMENTS

| | | | | |
|---|---|---|---|---|
| 6,153,940 A * | 11/2000 | Zakel et al. | | 257/779 |
| 6,163,463 A * | 12/2000 | Marrs | | 361/773 |
| 6,380,061 B1 * | 4/2002 | Kobayashi et al. | | 438/613 |
| 6,528,417 B1 * | 3/2003 | Wang et al. | | 438/665 |
| 6,583,514 B2 * | 6/2003 | Tago et al. | | 257/778 |
| 6,603,207 B2 * | 8/2003 | Bessho | | 257/778 |
| 6,664,637 B2 * | 12/2003 | Jimarez et al. | | 257/772 |
| 6,731,003 B2 * | 5/2004 | Joshi et al. | | 257/737 |
| 6,803,303 B1 * | 10/2004 | Hiatt et al. | | 438/612 |
| 6,864,168 B2 * | 3/2005 | Chen et al. | | 438/614 |
| 7,122,897 B2 * | 10/2006 | Aiba et al. | | 257/738 |

* cited by examiner

*Primary Examiner*—Luan C Thai

(57) ABSTRACT

Substrates including conductive pads for coupling the substrates to a microelectronic device and/or package are described herein. Embodiments of the present invention provide substrates comprising one or more conductive pads including a base portion and a pillar portion, the pillar portion being configured to couple with a microelectronic device. According to various embodiments of the present invention, the substrate may be a printed circuit board and/or may be a carrier substrate incorporated into an electronic package. The pillar portion may facilitate interconnection between the substrate and a microelectronic device or package by effectively raising the height of the conductive pad. Other embodiments may be described and claimed.

15 Claims, 5 Drawing Sheets

US 7,700,475 B1

PILLAR STRUCTURE ON BUMP PAD

CROSS REFERENCE TO RELATED APPLICATIONS

The present application is a non-provisional application of, and claims priority to, provisional application 60/828,331, entitled "PILLOR STRUCTURE ON BUMP PAD," filed on Oct. 5, 2006. The entire disclosure of said provisional application is hereby incorporated by reference in its entirety.

TECHNICAL FIELD

Embodiments of the present invention relate to the field of microelectronic devices, in particular, to microelectronic device processing and packaging.

BACKGROUND

In the current state of integrated circuit technology, a microelectronic device (e.g., an integrated circuit device) will often be in the form of a die. Such a die, or in some cases, more than one die, may be mounted onto an underlying substrate such as, for example, a carrier substrate to form a package. The package may then be physically and electrically coupled to another substrate such as, for example, a printed circuit board.

Interconnecting a die with a substrate, or a package with a substrate, may involve interconnecting the die or package to a bond pad of the substrate. The substrate may include many bond pads, which may be interconnected via traces, and a solder mask may cover at least some portion of the substrate. It has been discovered that the solder mask, and/or various other features of the substrate, may physically inhibit adequate electrical coupling between the bond pad and an interconnect material (e.g., a solder bump) coupled to the die or package.

SUMMARY OF THE INVENTION

In view of the challenges in the state of the art, embodiments of the present invention are directed to substrates comprising one or more conductive pads including a base portion and a pillar portion, the pillar portion being configured to couple with a microelectronic device. According to various embodiments of the present invention, the substrate may be a printed circuit board and/or may be a carrier substrate incorporated into an electronic package. The pillar portion may facilitate interconnection between the substrate and a microelectronic device or package by effectively raising the height of the conductive pad, sometimes above the height of a solder mask and/or other components or features located on the substrate.

According to various embodiments, the substrate includes a solder mask formed thereover. In various embodiments, the solder mask may have a height above the substrate relative to the height above the pillar portion adapted to facilitate the interconnection between the substrate and a microelectronic device mounted thereon. For example, in various ones of the embodiments, the solder mask may have a height that is lower than the height of the pillar portion.

In some embodiments, the base portion of the conductive pad may have a width that is greater than a width of the pillar portion, less than the width of the pillar portion, or coextensive with the width of the pillar portion. In some embodiments wherein the base portion is wider than the pillar portion, the solder mask may be formed over at least a portion of the base portion, or may be isolated from the base portion, depending on the application.

In various embodiments, the pillar portion and the base portion may comprise the same conductive material or may comprise different conductive materials, depending on the application. In some of the embodiments, at least the pillar portion comprises copper. In still other embodiments, both the pillar portion and the base portion may comprise copper.

According to various embodiments, a microelectronic device may be mounted onto the conductive pad of the substrate. In embodiments, the microelectronic device may be a flip-chip. In some embodiments, the microelectronic device may be mounted on the substrate and coupled thereto via a conductive interconnect material. The interconnect material may consist of a solder, a thermocompressive material, or a paste, depending on the application. For example, in various embodiments, the interconnect material comprises a solder bump.

In some embodiments, the microelectronic device may also include conductive pads including a base portion and a pillar portion, the pillar portion being adapted to couple to the substrate using an interconnect material.

According to various embodiments of the present invention, a method for making the conductive pads is also disclosed. In various ones of the embodiments, the method may include forming a conductive pad on a substrate, the conductive pad including a base portion and a pillar portion. In various embodiments, the pillar portion and the base portion are formed by etching a conductive material. In various other embodiments, the pillar portion may be formed by plating a conductive material onto the base portion.

Other features that are considered as characteristic for various embodiments of the present invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is, A is an optional element.

The terms chip, integrated circuit, monolithic device, semiconductor device, and microelectronic device are often used interchangeably in the microelectronics field. The present invention is applicable to all the above as they are generally understood in the field.

Figure 1:
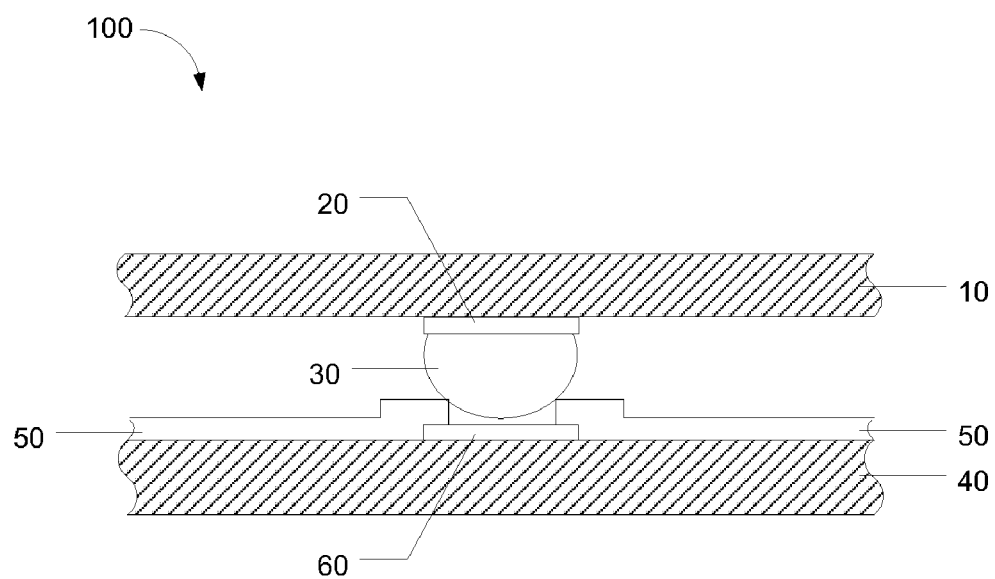
FIG. 1 is a cross-sectional side view of a microelectronic package known in the art.

According to various embodiments of the present invention, a novel structure is disclosed, which may avoid problems in the prior art such as those that may be encountered by the package 100 illustrated in FIG. 1. Illustrated is a microelectronic device 10 including a bond pad 20 disposed thereon, and a solder bump 30 disposed on bond pad 20. In mounting microelectronic device 10 onto a bond pad 60 of a substrate 40, solder mask 50 may physically interfere with the approach of solder bump 30 to bond pad 60 of substrate 40. During any subsequent reflow, or other coupling operations, solder bump 30 may not be guaranteed to make an effective electrical connection with bond pad 60 of substrate 40, thereby possibly resulting in a failure of package 100.

According to various embodiments of the present invention, a microelectronic package may include a substrate and conductive pads disposed on the substrate, with one or more of the conductive pads including a pillar portion. The pillar portion may facilitate interconnection between the substrate and a microelectronic device by effectively raising the height of the conductive pad, sometimes above the height of a solder mask and/or other components or features located on the substrate.

According to still further embodiments, a microelectronic device may include conductive pads disposed thereon, one or more of the conductive pads including a pillar portion. In some embodiments, the microelectronic device may be mounted onto a substrate, which may or may not also include conductive pads including a pillar portion.

Figure 2A:
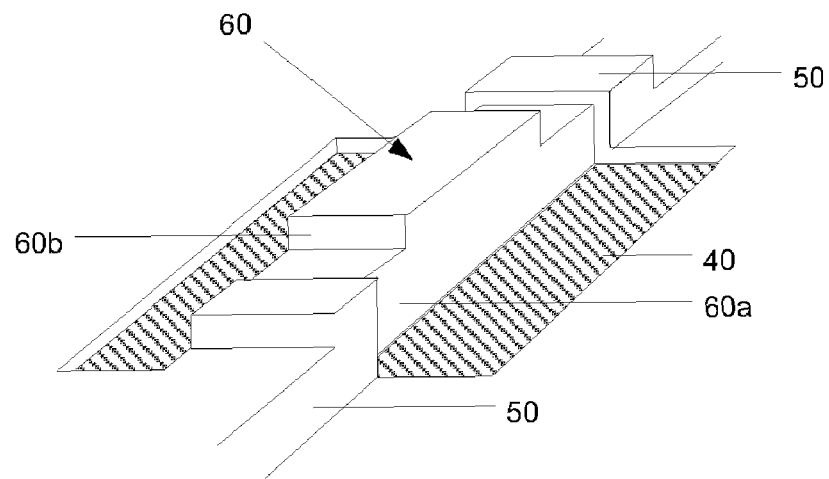
FIG. 2a is an isometric view of a substrate for a microelectronic package in accordance with various embodiments of the present invention.
Figure 2B:
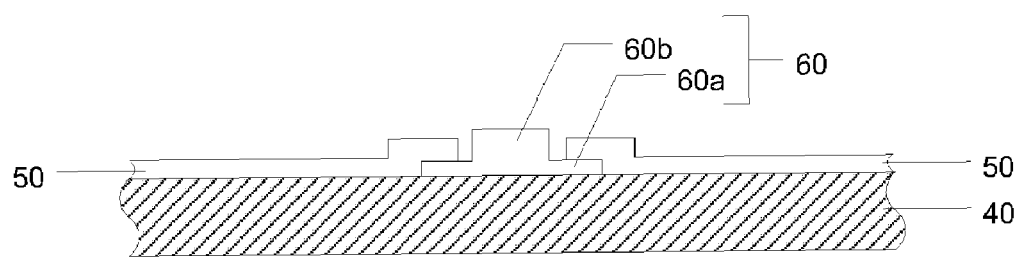
FIG. 2b is a cross-sectional side view of the substrate of FIG. 2a, in accordance with various embodiments of the present invention.

Referring now to FIGS. 2a and 2b, illustrated are isometric and cross-sectional side views, respectively, of a substrate 40, according to various embodiments of the present invention. Substrate 40 may be a carrier substrate or a printed circuit board, depending on the application. As illustrated, substrate 40 may include a conductive pad 60 disposed thereon and a solder mask 50 formed over a portion of both substrate 40 and conductive pad 60. Conductive pad 60, in accordance with various embodiments, includes a base portion 60a and a pillar portion 60b.

In various embodiments, conductive pad 60 is adapted to electrically couple with a microelectronic device via an interconnect material, with pillar portion 60b facilitating contact with the interconnect material. This facilitation may be due at least in part to the height of pillar portion 60b above substrate 40 relative to the height of solder mask 50 above substrate 40. As the height of conductive pad 60 is effectively increased over that of base portion 60a alone, an interconnect material is capable of physically contacting conductive pad 60 with greater ease as opposed to prior art packages such as, for example, the one illustrated in FIG. 1.

Pillar portion 60b and base portion 60a may be comprised of the same conductive material or may be comprised of different conductive materials. For example, in some embodiments, pillar portion 60b may be comprised of a first conductive material while base portion 60a may be comprised of a second, different conductive material. In general, however, it may be desirable to have pillar portion 60b and base portion 60a be comprised of the same conductive material, depending on the application. For example, in various embodiments, the entire conductive pad 60 (pillar portion 60b and base portion 60a) may comprise copper. Alternative or additional conductive materials may be enlisted, including, for example, gold, nickel, tungsten, aluminum, etc.

In embodiments wherein pillar portion 60b and base portion 60a comprise the same conductive material, conductive pad 60 may be formed either by etching away conductive material resulting in pillar portion 60b formation (and also simultaneously base portion 60a), or in various other embodiments, pillar portion 60b (and also simultaneously base portion 60a) may be formed by selectively plating conductive material onto substrate 40. In various embodiments, plating may comprise electroplating, electroless plating, or sputtering. In various other embodiments, pillar portion 60b may be plated up using conventional lamination techniques. In various embodiments, pillar portion 60b may advantageously be formed without requiring additional processing operations. In other words, pillar portion 60b may be formed in the normal course of conductive pad/trace formation.

Although the illustrated embodiments depict pillar portion 60b as a unitary pillar structure, in various other embodiments, pillar portion 60b may include multiple pillar structures. For example, in the embodiment illustrated in FIGS. 2a and 2b, pillar portion 60b may instead comprise two, three, or more pillars rather than the single pillar as illustrated. Furthermore, in various embodiments, pillar portion 60b may also be formed to have a shape different from the illustrated embodiment. For example, rather than pillar portion 60b having a generally rectangular shape, pillar portion 60b may be circular, triangular, cross-shaped, etc.

Figure 3:
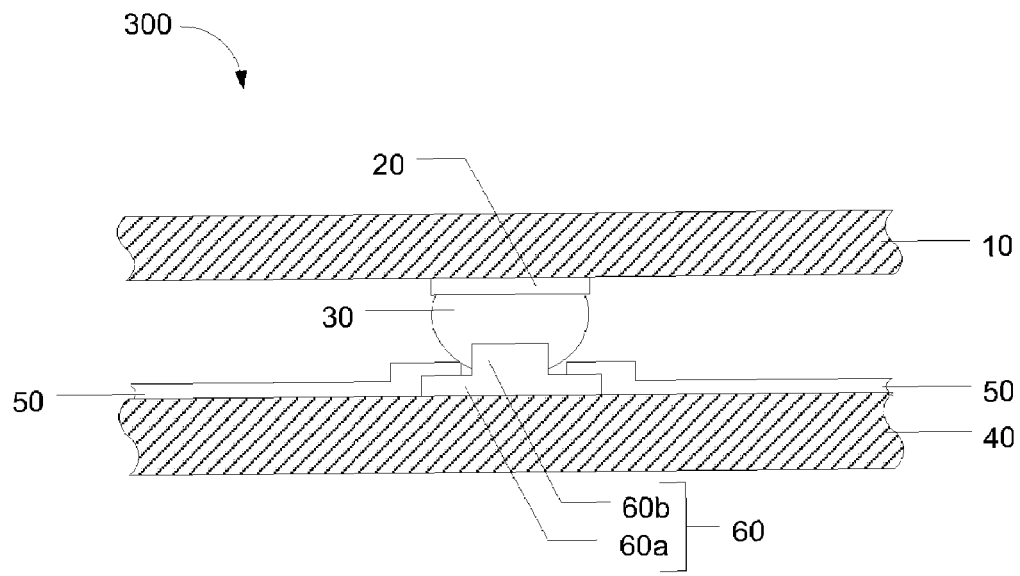
FIG. 3 is a cross-sectional side view of a microelectronic package incorporating the substrate of FIGS. 2a and 2b, in accordance with various embodiments of the present invention.

Turning now to FIG. 3, illustrated is a cross-sectional view of a microelectronic package 300 incorporating substrate 40 as illustrated in FIGS. 2a and 2b. In the illustrated embodiments, microelectronic package 300 includes substrate 40 and microelectronic device 10 including conductive pads 20, the substrate 40 and microelectronic device 10 interconnected by interconnect material 30. Substrate 40 may include conductive pad 60 disposed thereon and a solder mask 50, which is formed over a portion of conductive pad 60 in the illustrated embodiment. As discussed previously, conductive pad 60 includes a base portion 60a and a pillar portion 60b. It can be seen in the illustrated embodiment that pillar portion 60b allows for interconnect material 30 to establish effective coupling with conductive pad 60, even if partially blocked by solder mask 50.

Interconnect material 30 may comprise any material generally suitable for the purpose of interconnecting a microelectronic device or a package with a substrate. For example, interconnect material 30 may comprise a solder material, a thermocompressive material, or a conductive paste. Although various interconnect materials may be used, applications enlisting solder bumps (also known in the art as solder balls or spheres) may be particularly benefited by the embodiments described herein due at least in part to the hardness of the material, possibly leading to a greater likelihood of being physically obstructed by solder mask 50. With respect to solder bumps, any generally-known solder may be enlisted, including, for example, various alloys of silver, gold, tin aluminum, and indium.

It is noted that, for various embodiments described herein, microelectronic device 10 may be any microelectronic device known in the art. Although the illustrated embodiments may be regarded as depicting a flip-chip device, with an active surface of microelectronic device 10 facing down towards substrate 40, microelectronic package 300 need not necessarily be a flip-chip device. In various embodiments, a microelectronic device may comprise a package and a substrate may comprise a printed circuit board, the package coupled to the printed circuit board by one or more solder bumps (e.g., via a ball grid array).

Figure 4:
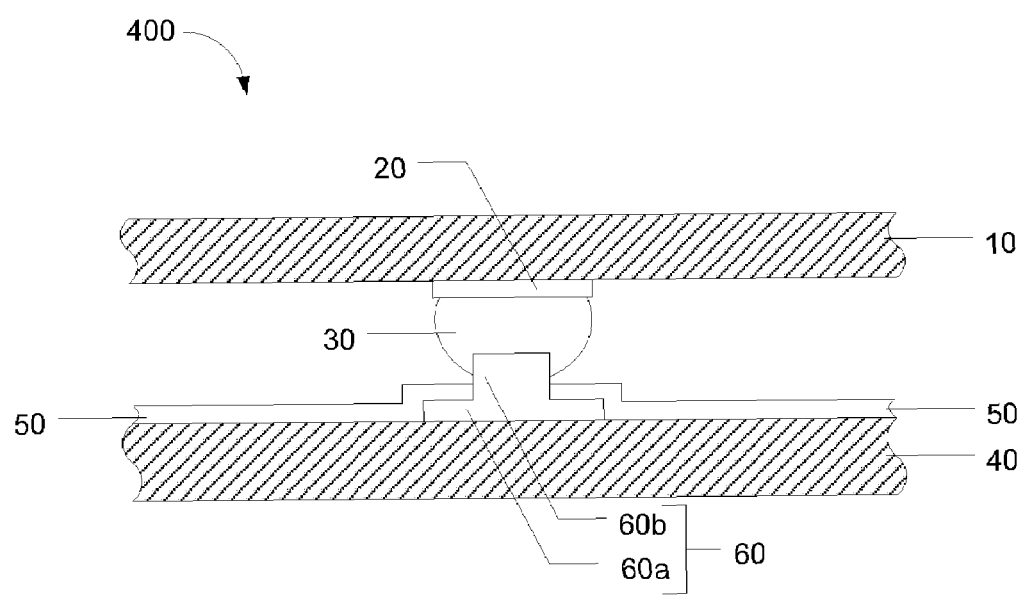
FIG. 4 is a cross-sectional side view of another microelectronic package, in accordance with various embodiments of the present invention.

In various embodiments, pillar portion 60b may be of a height sufficiently greater than that of solder mask 50, such that solder mask 50 may be formed over a greater surface area of substrate 40. In the embodiment illustrated in FIG. 4, for example, solder mask 50 is formed over base portion 60a. In contrast to prior art substrates, wherein such a configuration may effectively cover up conductive pad 60 (refer back to FIG. 1, for example), the embodiment illustrated in FIG. 4 may allow for the application of solder mask material without the concern for opening, or leaving open, adequately sized openings for interconnection. In the illustrated embodiment, solder mask 50 may be applied over substrate 40 while only requiring monitoring of the height (depth) of solder mask material. As in previously-discussed embodiments, microelectronic device 10 may include conductive pad 20 and may be interconnected to conductive pad 60 of substrate 40 via interconnect material 30.

Figure 5:
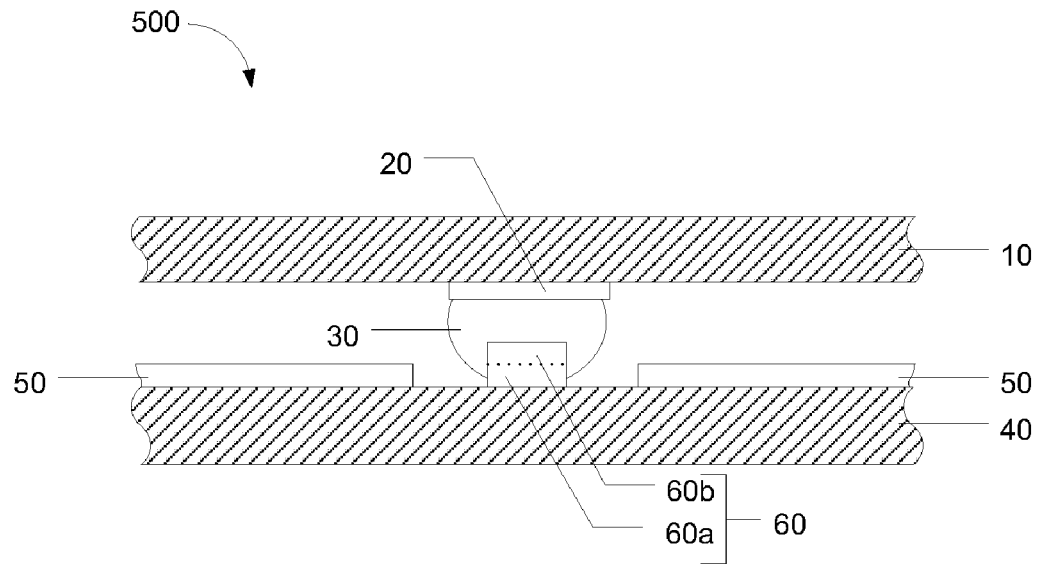
FIG. 5 is a cross-sectional side view of another microelectronic package, in accordance with various embodiments of the present invention.
Figure 6:
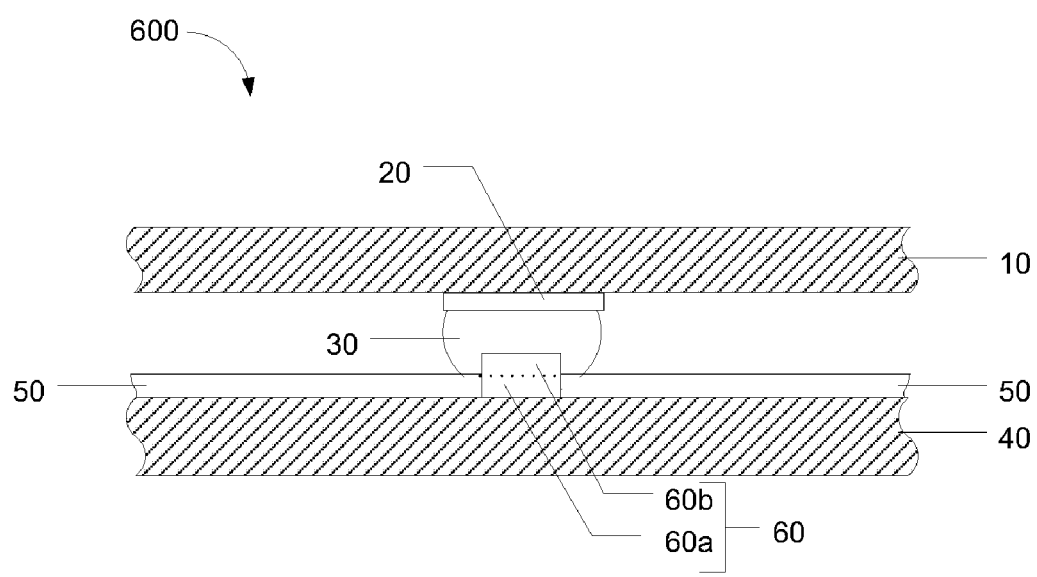
FIG. 6 is a cross-sectional side view of another microelectronic package, in accordance with various embodiments of the present invention.

Although embodiments of conductive pad 60 discussed so far generally depict base portion 60a as being wider than pillar portion 60b, other configurations may be possible. For example, as illustrated in FIGS. 5 and 6, conductive pad 60 includes a base portion 60a that has a width that is coextensive with the width of pillar portion 60b (demarcated, for illustration purposes only, by way of a hashed line). As in previously-discussed embodiments, microelectronic device 10 may include conductive pad 20 and may be interconnected to conductive pad 60 of substrate 40 via interconnect material 30. In these embodiments, solder mask 50 may be formed over substrate 40 such that some amount of clearance around at least some portion of conductive pad 60 remains, as illustrated in FIG. 5. In various other embodiments, however, solder mask 50 may extend up to conductive pad 60, which may accrue various benefits similar to those achieved by the embodiment illustrated in FIG. 4. Although not illustrated, in various other embodiments, a conductive pad may include a base portion that is narrower than the pillar portion.

Figure 7:
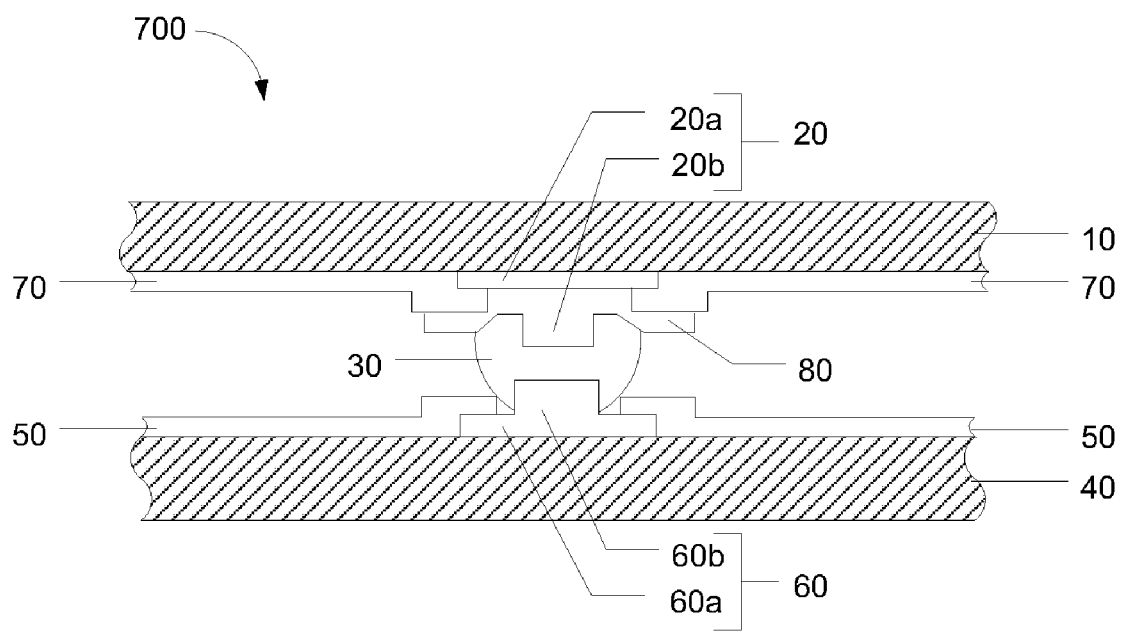
FIG. 7 is a cross-sectional side view of another microelectronic package, in accordance with various embodiments of the present invention.

In various embodiments, microelectronic device 10 may comprise one or more conductive pads 20 including a base portion and a pillar portion. In various ones of these embodiments, substrate 40 may or may not also include conductive pads 60 including a base portion and a pillar portion. In the embodiment illustrated in FIG. 7, for example, both microelectronic device 10 and substrate 40 include conductive pads 20, 60 including pillar portions 20b, 60b, respectively. As in previously-discussed embodiments, microelectronic device 10 may include conductive pad 20 and may be interconnected to conductive pad 60 of substrate 40 via interconnect material 30.

Microelectronic device 10 may include various other components and/or features, depending on the application. For example, the illustrated embodiment further includes a passivation layer 70 and an under-ball metallization layer 80 formed on at least base portion 20a of conductive pad 20. In embodiments, pillar portion 20b and under-ball metallization layer 80 may be integrally formed during the same fabrication process. In other embodiments, however, pillar portion 20b and under-ball metallization layer 80 may be separately formed.

Passivation layer 70 may be formed over various surfaces of microelectronic device 10 and may comprise any material suitable for the purpose, including, for example, oxide, nitride, polyimide, or oxynitride. Under-ball metallization layer 80 may be adapted to serve any one or more purposes including to support interconnect material 30 until adhesion is achieved (e.g., via reflow operations), provide a surface that is more readily adhered to by interconnect material 30 than conductive pad 20, or prevent diffusion of various components of interconnect material 20 to microelectronic device 10. Under-ball metallization layer 80 may comprise any material known in the art including, for example, chromium, copper, gold, nickel, or alloys thereof.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   providing a substrate;
   forming a conductive pad on the substrate to receive a spherical bump, the conductive pad including
   a base portion coupled to the substrate; and
   a pillar portion coupled to the base portion, the pillar portion to facilitate coupling of the substrate with a microelectronic device through the spherical bump, wherein the pillar portion and base portion are simultaneously formed by etching or selectively plating a conductive material, the base portion being formed to have a width that is greater than a width of the pillar portion; and
   forming a solder mask over the substrate, the solder mask having a height above the substrate that is lower than a height of the pillar portion above the substrate.

2. The method of claim 1, wherein the base portion and the pillar portion are formed using copper.

3. The method of claim 1, further comprising mounting the microelectronic device onto the substrate.

4. The method of claim 3, wherein the microelectronic device is mounted on the conductive pad and coupled to the conductive pad using a conductive pad disposed on the microelectronic device, the conductive pad of the microelectronic device including a base portion and a pillar portion, the pillar portion of the microelectronic device being coupled to the substrate via the spherical bump.

5. The method of claim 1, wherein said forming the solder mask over the substrate comprises:

depositing the solder mask material to substantially cover the base portion but not the pillar portion, wherein said depositing is not followed by any subsequent removal of the solder mask over the conductive pad.

6. The method of claim 5, wherein said depositing is performed by only monitoring a height or thickness of the solder mask over the substrate.

7. A method comprising:

providing a microelectronic device;

forming a conductive pad on the microelectronic device to receive a spherical bump, the conductive pad including a base portion coupled to the microelectronic device; and a pillar portion coupled to the base portion, the pillar portion to facilitate coupling of the microelectronic device with a substrate through the spherical bump; and forming an under-ball metallization layer on the base portion to at least increase adherence to the conductive pad by the spherical bump, wherein the under-ball metallization layer and the pillar portion are integrally formed during the same fabrication process, the same fabrication process not being a wire-bonding process.

8. The method of claim 1, wherein forming the conductive pad comprises forming the pillar portion to have a substantially rectangular surface to receive the spherical bump.

9. The method of claim 1, wherein forming the conductive pad comprises forming the pillar portion to have multiple pillar structures.

10. The method of claim 1, wherein forming the solder mask comprises depositing the solder mask to the base portion of the conductive pad such that the solder mask covers at least a portion of the base portion.

11. The method of claim 7, wherein forming the under-ball metallization layer comprises depositing a material including at least one of chromium, copper, gold, and nickel.

12. The method of claim 7, further comprising:

forming a passivation layer coupled to the microelectronic device and further coupled to the base portion such that the passivation layer covers at least a portion of the first base portion;

wherein the under-ball metallization layer is coupled to the first base portion and further coupled to the passivation layer such that the under-ball metallization layer covers at least a portion of the passivation layer.

13. The method of claim 7, wherein forming the passivation layer comprises depositing a material comprising polyimide.

14. The method of claim 7, further comprising:

mounting the microelectronic device onto the substrate.

15. The method of claim 14, wherein mounting the microelectronic device onto the substrate comprises coupling the conductive pad of the microelectronic device to the substrate using a conductive pad disposed on the substrate, the conductive pad of the substrate including a base portion and a pillar portion, the pillar portion of the substrate being coupled to the conductive pad of the microelectronic device via the spherical bump.

* * * * *